(12) United States Patent
Cromer et al.

(10) Patent No.: US 10,812,940 B2
(45) Date of Patent: Oct. 20, 2020

(54) FLEXIBLE ANTI-THEFT PACK FOR TRACKING AND LOCATION

(71) Applicant: 3SI Security Systems, Inc., Malvern, PA (US)

(72) Inventors: Brandon Cromer, Lawrenceville, GA (US); Terry Hipp, Lawrenceville, GA (US); Mary Pifer, Telford, PA (US)

(73) Assignee: 3SI Security Systems, Inc., Malvern, PA (US)

( * ) Notice: Subject to any disclaimer, the term of this patent is extended or adjusted under 35 U.S.C. 154(b) by 0 days.

(21) Appl. No.: 16/516,959

(22) Filed: Jul. 19, 2019

(65) Prior Publication Data

US 2020/0221258 A1 Jul. 9, 2020

Related U.S. Application Data

(60) Provisional application No. 62/701,039, filed on Jul. 20, 2018.

(51) Int. Cl.
*H05K 1/02* (2006.01)
*H04W 4/029* (2018.01)
(Continued)

(52) U.S. Cl.
CPC ............ *H04W 4/029* (2018.02); *H05K 1/028* (2013.01); *H05K 1/189* (2013.01); *H05K 1/147* (2013.01);
(Continued)

(58) Field of Classification Search
CPC .................................. H04W 4/02; H05K 1/02
See application file for complete search history.

(56) References Cited

U.S. PATENT DOCUMENTS 3,564,525 A  2/1971  Robeson et al.
3,618,059 A  11/1971  Allen
(Continued)

FOREIGN PATENT DOCUMENTS

DE  3400526  10/1985
DE  3530473  3/1987
(Continued)

OTHER PUBLICATIONS

Applications of battery power supply devices and battery drive circuit design, Application No. No. 104, Seiko Instruments, Inc. May 15, 1999.

*Primary Examiner* — Michael T Vu
(74) *Attorney, Agent, or Firm* — Morgan, Lewis & Bockius LLP

(57) ABSTRACT

An electronic tracking device comprising: a first power cell positioned on a first portion of a substrate; a second power cell positioned on a second portion of the substrate, the second power cell being spaced apart from the first power cell by a gap; the substrate comprising a flexible printed circuit board having a flexure disposed along a central transverse axis of the substrate between the first portion and the second portion of the substrate, the flexure being bendable to allow the first portion to move relative to the second portion between a first configuration wherein the first portion is substantially coplanar with the second portion of the substrate and a second configuration wherein the first portion and the second portion of the substrate forms an angle of greater than or less than about 180 degrees, wherein, in the first configuration, a center of mass of the electronic tracking device is located in the gap between the first power cell and the second power cell.

7 Claims, 9 Drawing Sheets

(51) Int. Cl.
*H05K 1/18* (2006.01)
*H05K 1/14* (2006.01)

(52) U.S. Cl.
CPC .......... *H05K 2201/055* (2013.01); *H05K 2201/10037* (2013.01); *H05K 2201/10098* (2013.01)

(56) References Cited

U.S. PATENT DOCUMENTS

| | | | |
|---|---|---|---|
| 3,828,341 | A | 8/1974 | Carter, Jr. et al. |
| 4,021,807 | A | 5/1977 | Culpepper et al. |
| 4,511,888 | A | 4/1985 | Bernhardt |
| 4,559,529 | A | 12/1985 | Bernhardt |
| 4,855,713 | A | 8/1989 | Brunius |
| 4,975,680 | A | 12/1990 | Fogle, Jr. |
| 5,059,949 | A | 10/1991 | Caparoni et al. |
| 5,091,713 | A | 2/1992 | Horne et al. |
| 5,196,828 | A | 3/1993 | Keniston |
| 5,223,844 | A | 6/1993 | Mansell et al. |
| 5,266,958 | A | 11/1993 | Durboraw, III |
| 5,367,148 | A | 11/1994 | Storch et al. |
| 5,392,052 | A | 2/1995 | Eberwine |
| 5,448,223 | A | 9/1995 | Johnson |
| 5,485,143 | A | 1/1996 | Keniston |
| 5,515,032 | A | 5/1996 | Johnson |
| 5,554,993 | A | 9/1996 | Brickell |
| 5,557,254 | A | 9/1996 | Johnson et al. |
| 5,594,425 | A | 1/1997 | Ladner et al. |
| 5,682,133 | A | 10/1997 | Johnson et al. |
| 5,748,084 | A | 5/1998 | Isikoff |
| 5,838,237 | A | 11/1998 | Revell et al. |
| 5,952,920 | A | 9/1999 | Braddick |
| 6,025,777 | A | 2/2000 | Fuller et al. |
| 6,072,396 | A | 6/2000 | Gaukel |
| 6,121,922 | A | 9/2000 | Mohan |
| 6,246,337 | B1 | 6/2001 | Rosenberg et al. |
| 6,249,217 | B1 | 6/2001 | Forbes |
| 6,249,245 | B1 | 6/2001 | Watters et al. |
| 6,353,390 | B1 | 3/2002 | Beri et al. |
| 6,362,736 | B1 | 3/2002 | Gehlot |
| 6,552,660 | B1 | 4/2003 | Lisowski |
| 6,801,129 | B2 | 10/2004 | Grimm |
| 7,171,187 | B2 | 1/2007 | Haave et al. |
| 7,656,292 | B2 | 2/2010 | Bartholf et al. |
| 7,902,980 | B2 | 3/2011 | Grimm |
| 8,217,791 | B2 | 7/2012 | Grimm |
| 9,936,581 | B1 * | 4/2018 | Bergman ............... H05K 3/323 |
| 2001/0040506 | A1 | 11/2001 | Boulay et al. |
| 2002/0070874 | A1 | 6/2002 | Williams et al. |
| 2008/0198002 | A1 * | 8/2008 | Bartholf ............ G08B 13/2402 340/539.13 |

FOREIGN PATENT DOCUMENTS

| | | |
|---|---|---|
| DE | 29614823 | 10/1996 |
| DE | 29702771 | 4/1997 |
| DE | 29919554 | 3/2000 |
| DE | 19920128 | 12/2000 |
| EP | 1098205 | 5/2001 |
| FR | 2822277 | 9/2002 |

* cited by examiner

FLEXIBLE ANTI-THEFT PACK FOR TRACKING AND LOCATION

CROSS-REFERENCE TO RELATED APPLICATIONS

The present application claims priority to U.S. Provisional Patent Application No. 62/701,039 filed on Jul. 20, 2018, which is incorporated herein by reference in its entirety.

FIELD OF THE INVENTION

The present invention relates to an anti-theft pack for tracking and location of objects, ideally for use in currency anti-theft applications.

BRIEF SUMMARY

In one embodiment there is an electronic tracking device comprising: a power pack including a first power cell positioned on a first portion of a substrate; a second power cell positioned on a second portion of the substrate, the second power cell being spaced apart from the first power cell by a gap; the substrate comprising a flexible printed circuit board having a flexure disposed along a central transverse axis of the substrate between the first portion and the second portion of the substrate, the flexure being bendable to allow the first portion to move relative to the second portion between a first configuration wherein the first portion is substantially coplanar with the second portion of the substrate and a second configuration wherein the first portion and the second portion of the substrate forms an angle of greater than or less than about 180 degrees (e.g., from 10 degrees to 360 degrees, 20 degrees to 360 degrees, less than 90 degrees, etc.), wherein, in the first configuration, a center of mass of the electronic tracking device is located in the gap between the first power cell and the second power cell. In some embodiments, a flexible mount, e.g., a polycarbonate mount is used to attach the battery pack to the flexible printed circuit board without restricting the motion of the battery pack or the electronic tracking device.

BRIEF DESCRIPTION OF THE SEVERAL VIEWS OF THE DRAWINGS

The foregoing summary, as well as the following detailed description of embodiments of the invention, will be better understood when read in conjunction with the appended drawings of an exemplary embodiment. It should be understood, however, that the invention is not limited to the precise arrangements and instrumentalities shown.

In the drawings.

DETAILED DESCRIPTION OF THE INVENTION

Currency anti-theft devices, in the form of, for example, dye packs, alarm packs, or tracking packs, are used by the banking industry, financial institutions, and retail markets to facilitate detection and deterrence of theft and to assist in the apprehension of criminals. Dye packs typically release smoke or dye to stain the currency, which draws attention to the robber, renders the currency useless, and creates evidence of the theft. Dye packs may also contain tear gas to disorient the robber and aid apprehension. These dye packs can be designed to mimic the look and feel of a regular stack of currency.

Other currency anti-theft devices have been designed for the purpose of tracking. The existing art does not offer the realism that is required to adequately disguise tracking and recovery devices in a currency pack, however, so there is still a need in the art for a currency anti-theft device with tracking capability, having flexibility sufficient to simulate a genuine stack of currency to reduce the likelihood that a robber will be able to distinguish the anti-theft device from a real pack of currency.

Figure 1:
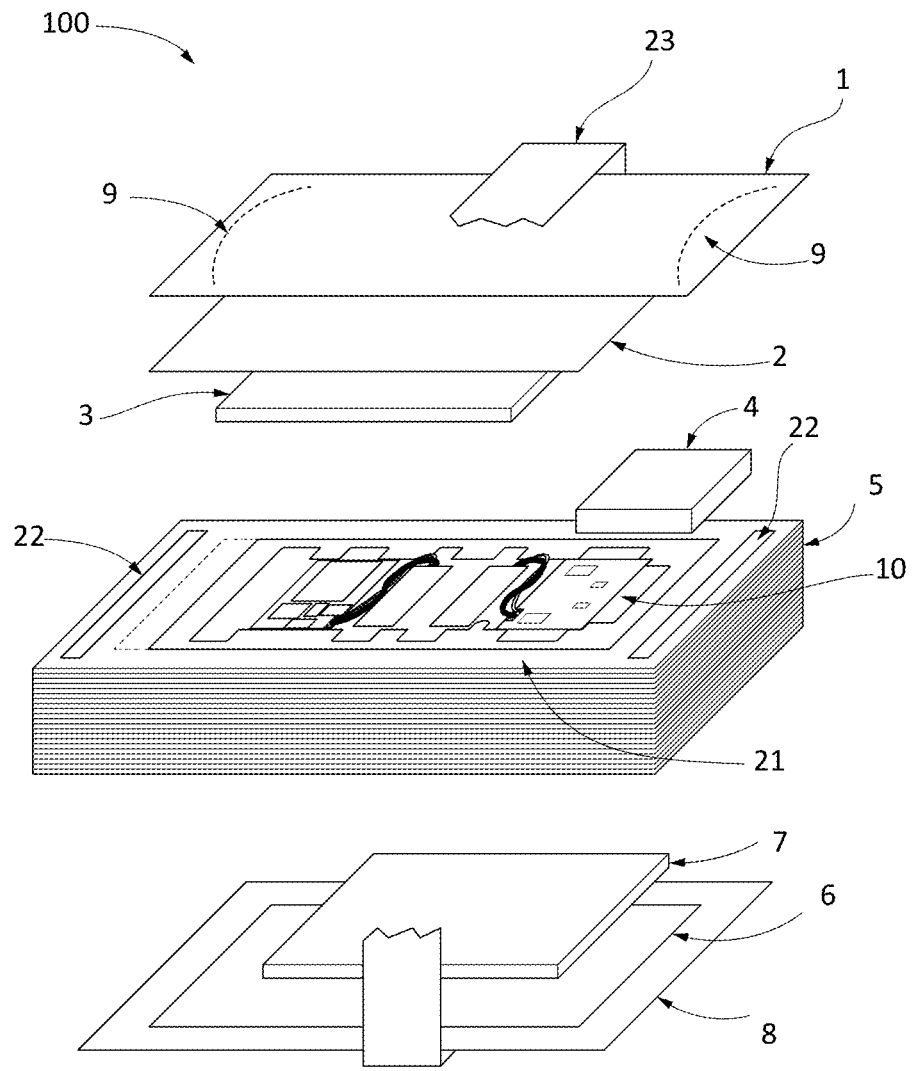
FIG. 1 is an expanded perspective view of an exemplary currency anti-theft pack including a location tracking assembly, in accordance with an exemplary embodiment of the present invention.

Referring to the drawings in detail, wherein like reference numerals indicate like elements throughout. There is shown in FIG. 1 a currency anti-theft pack, generally designated 100, in accordance with an exemplary embodiment of the present invention. In some embodiments, anti-theft pack 100 contains a location tracking assembly 10 which may include electronic modules configured to provide remote tracking capabilities. For example, as will be described in further detail below, location tracking assembly 10 may include one or more of a wireless communication module, a Global Navigation Satellite System (GNNS) for LTE, RF transmitter/transceiver, power cells, etc. Location tracking assembly 10, in some embodiments, may be positioned within a housing 5. Housing 5, in some embodiments, may have the appearance of an object of value such that, for example, anti-theft pack 100 may be placed amongst a group of such objects and be hidden therein. In some embodiments, housing 5 is configured to have the appearance of a stack of currency bills. Housing 5, in some embodiments, may be formed, at least in part, by a stack of individual sheets, such as, for example, genuine currency bills, having a hollow cutout that is sized to receive location tracking assembly 10 therein. The stack of sheets (e.g., currency bills) may include two or more sheets, e.g., 2 to 5 sheets, 2 to 10 sheets, 2 to 20 sheets, 2 to 30 sheets, 2 to 40 sheets, 2 to 50 sheets, 2 to 100 sheets, 2 to 200 sheets, or 2 to 250 sheets. The hollow cutout may be positioned generally in the center of the stack of currency bills and be formed by removing a portion of some or each of the bills. In some embodiments, the bills may be fastened together by a pair of lacing threads 9, such as an elastic cord, which is passed through small holes located near the outer edge of the bills, but far enough from the edge to provide a realistic feel when "riffling" the edges of the bill pack. Alternatively, in some embodiments, other fasteners configured to maintain the stack of individual sheets may be used to hold the bills together, for example, elastic bands, tape, staples, clips, tacks, etc.

In some embodiments, location tracking assembly 10 may be positioned between two or more flexible cover sheets, for example, flexible top and bottom cover sheets 2 and 6, respectively. Flexible top and bottom cover sheets 2 and 6, for example, may each, comprise a thin plastic sheet or film such as but not limited to polyethylene, and may be secured to the housing and positioned adjacent a top side and adjacent a bottom side of the location tracking assembly 10 to retain the location tracking assembly 10 within the housing. In some embodiments, the flexible cover sheets 2 and 6 may be affixed to the currency bills, such as with lacing threads 9 or tape (not shown). In one embodiment, one end of the top cover sheet is affixed to the currency bills while the other, free end remains unrestrained to allow access to the components of the location tracking assembly 10. This free end may be held in place by positioning it under the lacing thread. In an alternative embodiment, both ends may be secured by positioning them under lacing threads, with neither end actually bound into the housing. In some embodiments, anti-theft pack 100 includes one or more cushioning elements which are positioned and configured to help protect and/or provide cushioning support to location tracking assembly 10. The one or more cushioning elements may be made of a foam or other elastic/resilient material and be located within housing 5 and/or between location tracking assembly 10 and flexible cover sheets 2 and 6 according to some embodiments. For example, in the illustrated embodiment, anti-theft pack 100 includes top and bottom cushioning elements 3 and 7 respectively, which may be, for example, polyethylene foam or polyurethane foam sheets, and which are positioned between the location tracking assembly 10 and the cover sheets 2 and 6, respectively. In a preferred embodiment, each of the cushioning elements has at least one face that has a smooth surface, which is positioned adjacent to the tracking assembly to promote sliding for improved flexibility. Additional cushioning elements, such as filler foam 4, may be used to further disguise the contents of the location tracking assembly 10, helping to provide a more realistic compliant feel to the currency anti-theft pack.

In use, one or more genuine currency bills, 1 and 8, are positioned on either side of the housing 5 to conceal the location tracking assembly 10 and to give a realistic appearance to the currency anti-theft pack 100. The currency bills may be attached to the laced bill pack assembly using one or more small pieces of double sided tape 22, for example. The completed currency pack may be wrapped with a standard bank money strap 23 to add mechanical stability and to further enhance the realistic appearance of the currency anti-theft pack.

The location tracking assembly 10 may also be flexible at certain positions. For example, when the location tracking assembly 10 is positioned in the housing 5, the currency pack 100 may still be bendable and flexible in different ways, including the ability to bend the pack into a "U" shape without damaging internal components. In one embodiment, the currency pack 100 may include two or more currency bills.

The foregoing description is but one configuration for providing a flexible housing. The invention is not limited to any particular housing configuration, however, nor even limited to a housing that resembles a stack of currency. What is important is that the housing provide an overall compliant feel that does not betray the contents inside. Thus, other applications where a flexible tracking device is required may also benefit from the flexibility of the tracking and location assembly described below inside a flexible housing.

Location tracking assembly 10 is configured to be flexible such that anti-theft pack 100 as a whole is allowed to bend in accordance with certain embodiments of the present invention. This flexibility, in some embodiments, adds to the realistic feel and appearance of anti-theft pack 100 such that its presence may not be readily detectable when handled by a person. For example, in some embodiments, wherein location tracking assembly 10 is positioned within a housing 5 made from stack of currency bills, someone handling the anti-theft pack 100 will be able to bend and flex anti-theft pack 100 in manners as if it was a regular stack of currency bills. In some embodiments, for example, location tracking assembly 10 is capable of bending from a generally flat or planar first configuration into a U-shape, S-shape, W-shape, and/or other bent configurations while still maintaining its tracking functionality.

Figure 2:
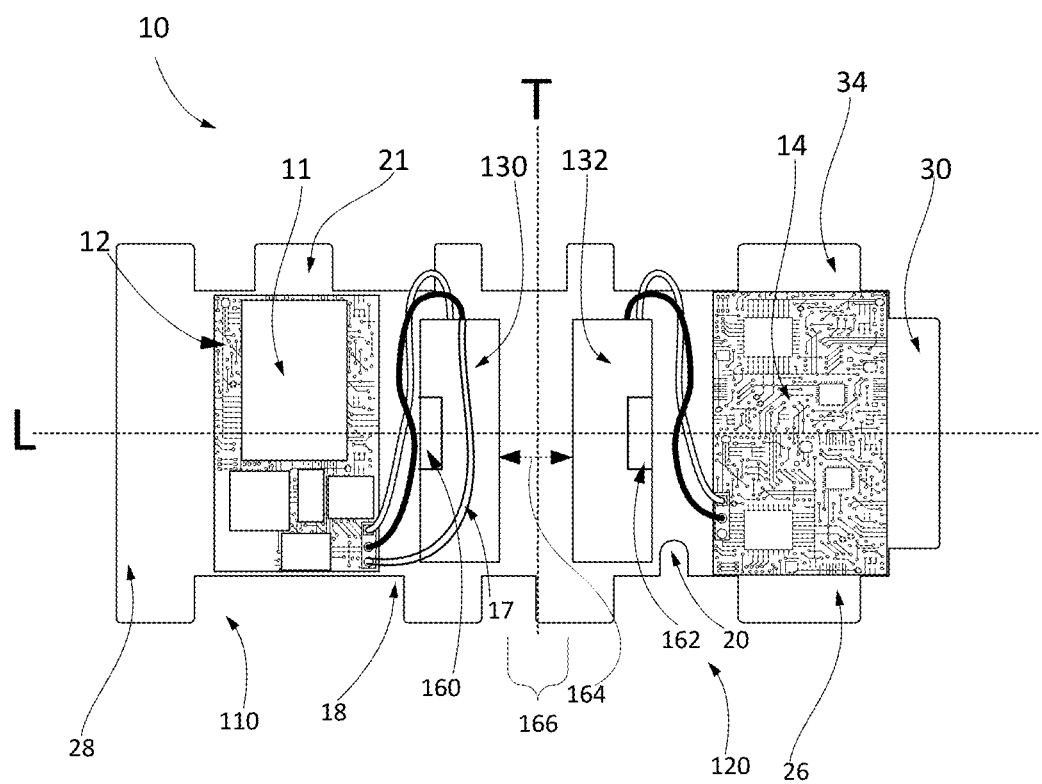
FIG. 2 is a top plan view of an exemplary location tracking assembly of the currency anti-theft pack of FIG. 1, in a first planar configuration in accordance with an exemplary embodiment of the present invention.

Referring now to FIG. 2, the location tracking assembly 10 in a first configuration is shown. In the first configuration, the location tracking assembly 10 is substantially flat. As will be discussed in further detail, in some embodiments, the location tracking assembly 10 can be transitioned to a second configuration where the location tracking assembly 10 is substantially bent in a "U" shape to simulate currency without damage to internal components.

In some embodiments, location tracking assembly 10 includes a flexible substrate 18 onto which one or more electronics modules are positioned. In some embodiments, one or more electronics modules may be positioned on one or more printed circuit board assemblies which are coupled to flexible substrate 18. The printed circuit board assemblies may include either flexible or rigid printed circuit boards. In some embodiments, flexible substrate 18 may include electrically conductive traces to allow communication between different printed circuit board assemblies. In some embodiments, for example, location tracking assembly 10 may comprise a wireless communications module 11 positioned on a first rigid printed circuit board assembly 12, cellular antenna 28, a power pack including or consisting of a first power cell 130 and a second power cell 132, and a second rigid printed circuit board assembly 14. In some embodiments, wireless communications module 11 may include, for example, a cellular modem, and may be an LTE Cat M1 compatible module configured for Internet of Things (IoT) or machine-to-machine (M2M) communications. Cellular antenna 28, in some embodiments, may be positioned on a tab of flexible substrate 18 which extends from first rigid printed circuit board assembly 12. In some embodiments, second rigid printed circuit board assembly 14 includes modules configured for tracking, for example, a global positioning system (GPS) electronics module (e.g., Global Navigation Satellite System (GNSS) for LTE), beacon circuitry, WIFI circuitry, and/or one or more microprocessors. In some embodiments location tracking assembly 10 further includes a Wifi Antenna 34, GNSS antenna 26 and beacon antenna 30 which may be positioned on tabs of flexible substrate 18 which extend from second rigid printed circuit board assembly 14. In other embodiments, the location of the beacon antenna 30 may be on the second rigid printed circuit board assembly 14. In certain embodiments, as illustrated, the power pack including first power cell 130 and second power cell 132 may be positioned on flexible substrate 18 between first rigid printed circuit board assembly 12 and second rigid printed circuit board assembly 14. In some embodiments, as will be described further herein, flexible substrate 18 may include one or more flexures between the different components 12, 14, 130, 132 such that location tracking assembly 10 is capable of bending at these regions. In some embodiments, the components 12, 14, 130, and/or 132 may be interconnected by a flexible interconnect 17, such as but not limited to, individual wiring, ribbon cable, or flexible PCB material with printed conductors.

In one embodiment, the wireless communications module 11 and first rigid printed circuit assembly 12 are mobile communications (e.g., long-term evolution (LTE)) compatible. While LTE is a popular standard for mobile phones that is currently widespread and well known in the art, the communications antenna and electronics are not limited to any particular wireless communications or cellular phone technology. Components compatible with any technology capable of providing communications for the purposes described herein, are acceptable, including but not limited to RF transmitters or transceivers. Similarly, although GPS electronics and antenna systems in current use conform to a certain technology, the term "GPS" is not intended to be limited to any particular technology for global positioning, and should be read to encompass any technology capable of providing geographic location information sufficient for tracking and location. Furthermore, the functional cooperation between the wireless communications technology and GPS technology to provide location information to a user trying to track the device may be coordinated by any controller known in the art and may utilize any technology known in the art, including but not limited to the technologies described in the references cited herein above and incorporated by reference.

In some embodiments, as discussed, location tracking assembly 10 includes a power pack consisting of two or at least two power cells which are configured for supplying power to the other electronic modules. As shown in the illustrated embodiment of FIG. 2, location tracking assembly includes a first power cell 130 and a second power cell 132 which each may be configured to provide power to first rigid printed circuit assembly 12 and second rigid printed circuit assembly 14 of the location tracking assembly 10. In some embodiments, the power cells 130, 132 are batteries or any other portable device that can provide power. In one embodiment, power cells 130, 132 may include a battery assembly comprising a first battery and a second battery, such as but not limited to a flat lithium ion or metal hydride battery, connected to a flat flexible battery interconnect cable 17. The power cells 130, 132 may be configured to provide a reliable electrical connection to the modules while allowing convenient insertion and replacement of other batteries.

The first power cell 130 and the second power cell 132 may be positioned towards the geometric center of the location tracking assembly 10, yet may be spaced apart from each other by a gap 164. In one embodiment, the gap 164 between the first power cell 130 and the second power cell 132 may be approximately 1 cm in length; approximately less than 1 cm in length; approximately 0.5 cm in length or approximately less than 0.5 cm in length. In one embodiment, the midpoint of the gap between the first power cell 130 and second power cell 132 may be the central transverse axis T of the location tracking assembly 10. The central transverse axis T may be the axis positioned in the center of the width of the location tracking assembly 10. The substrate 18 may comprise a flexible printed circuit board ("FPCB") optionally having a flexure 166 disposed along a central transverse axis T of the substrate 18. For example, the flexure 166 may be positioned between the first portion 110 of the substrate 18 (e.g., left side of location tracking assembly 10 in FIG. 2) and the second portion 120 of the substrate 18 (e.g., right side of location tracking assembly 10 in FIG. 2). Because the location tracking assembly 10 is flexible at the flexure 166, the location tracking assembly 10 may be bent or flexed in a "U" shaped configuration, thereby better simulating how money is usually handled by people. Location of the first power cell 130 and second power cell 132 positioned a distance apart, such that the transverse axis is empty, may provide for a more even weight distribution and a "balanced" feel. As with the other components, however, the power assembly is not limited to any particular configuration or set of components, and other configurations may be provided.

The substrate 18 may comprise an insulating polymer film having one or more conductive circuit patterns extending through the flexure 166 from the first portion 110 to the second portion 120. This allows the first and second rigid printed circuit board assemblies 12, 14 and the electronic modules positioned thereon to be interconnected and operable while the location tracking assembly 10 is disposed in the currency pack.

In one embodiment, the mass of the first portion 110 of the substrate 18 may be substantially equivalent to the mass of the second portion 120 of the substrate 18. The first power cell 130 and the second power cell 132 may be positioned closer to the central transverse axis than components 11, 12 and 14. In these embodiments, because the mass of the power cells 130, 132 exceed the mass of the other components 11, 12 and 14, the center of mass of the tracking assembly 10 may be at or near the central transverse axis T. In some embodiments, the center of mass of tracking assembly 10 may be located within gap 164 between first power cell 130 and second power cell 132 when tracking assembly 10 is in the first, planar configuration.

In some embodiments, location tracking assembly 10 may be about 6 cm in length and about 13 cm in width. The first power cell 130 may be about 45 mm±2 mm in length, 15.5 mm maximum in width and about 4.6 mm depth without the label and 4.8 mm with the label in depth. The second power cell 132 may be about 5 cm in length, 1.4 cm in width and 0.2 cm in depth. The first portion 110 of the substrate 18 may be 6 cm in length and 6.5 cm in width. The second portion 120 of the substrate 18 may be 6 cm in length and 6.5 cm in width. The first power cell 130 may be positioned 0.5 cm to the left of the central transverse axis T and the second power cell 132 may be positioned 0.5 cm to the right of the central transverse axis T. This configuration, in some embodiments, allows the location tracking assembly 10 when positioned in a currency pack to simulate how money may feel when held by a person.

Stabilization tabs 21 extending from the hollowed cutout into the space between adjacent bills in the housing as shown in FIG. 2, may be optionally included on one or more of the modules, or included as part of the flexible interconnect PCB or flexible substrate 18 as applicable. Stabilization tabs 21 allow sliding motion relative to the length of the currency pack and help retain the location tracking assembly within the currency pack without restricting the flexibility of the currency anti-theft pack.

Figure 3:
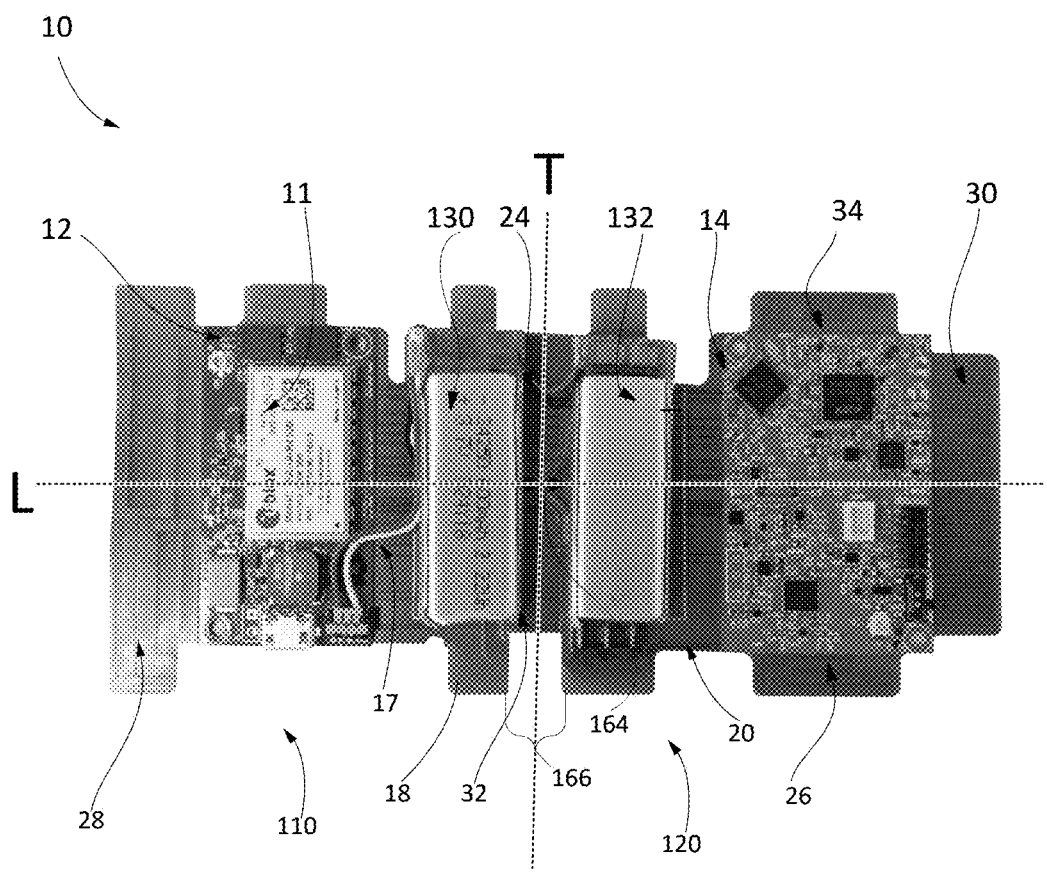
FIG. 3 is a top plan view of an exemplary location tracking assembly, in a first, planar configuration in accordance with an exemplary embodiment of the present invention.

Referring now to FIG. 3, the location tracking assembly 10 in a first configuration is shown. In contrast with FIG. 2, the configuration illustrated in FIG. 3 shows first power cell 130 and second power cell 132 being electrically connected with battery wire 24. Second power cell 132 may be connected to second rigid printed circuit assembly 14 through insulated traces on flexible substrate 18, such as a stripline. In another embodiment, second power cell 132 may not be connected to second rigid printed circuit assembly 14. A flexible mount 32 may be used to attach the battery pack to the flexible substrate 18, without restricting motion. In some embodiments, flexible mount 32 may be constructed from a thin polymer sheet or film, for example, polycarbonate, to which first power cell 130 and second power cell 132 may be coupled. In some such embodiments, flexible mount 32 is sized and shaped to be positioned on flexible substrate 18 between first rigid printed circuit assembly 12 and second rigid printed circuit assembly 14.

Figure 4:
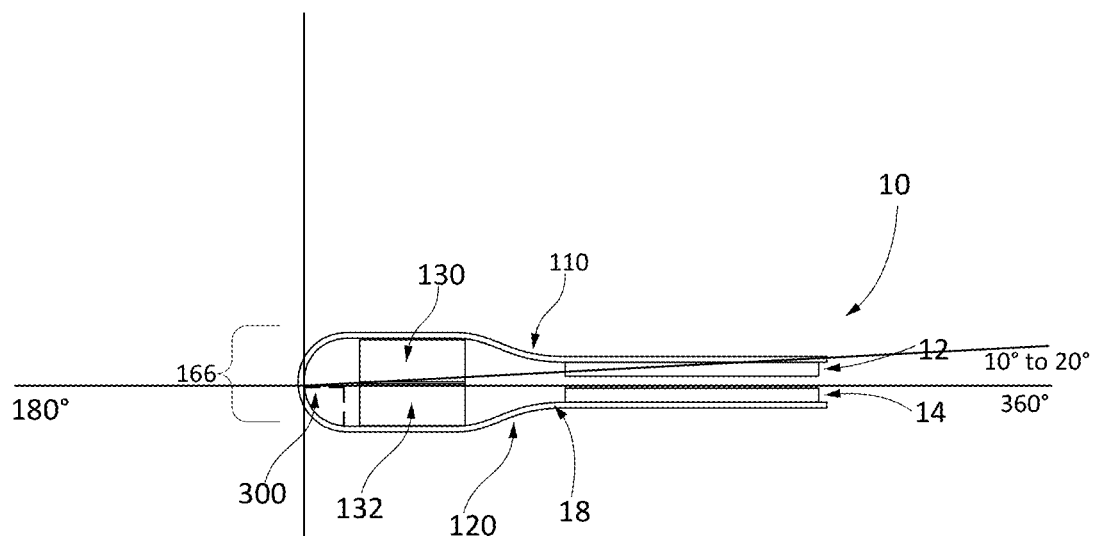
FIG. 4 is a side view of the exemplary location tracking assembly of FIG. 2, in a second, bent configuration in accordance with an exemplary embodiment of the present invention.

Referring now to FIG. 4, the location tracking assembly 10 may be bendable from a first configuration of 180 degrees (shown in FIG. 2 and FIG. 3) to a second configuration (shown in FIG. 4) at the flexure 166. When bent to the second configuration by a stress applied to the location tracking assembly 10, the tracking assembly 10 may form a "U" shape. The bendability may allow the first portion 110 of the substrate 18 to move relative to the second portion 120 of the substrate 18, between the first configuration where the first portion 110 is substantially coplanar to the second portion 120, to a second configuration where the first portion 110 and the second portion form an angle of less than 180 degrees; less than 90 degrees; less than 45 degrees; less than 30 degrees, less than 20 degrees; or about 10 degrees. In some embodiments, first portion 110 and second portion 120 may bend from 180 degrees in the first configuration to a minimum angle of about 0 degrees to about 20 degrees. In another embodiment, the minimum angle formed may be anywhere from 10 degrees to 20 degrees. In some embodiments, the location tracking assembly 10, while in the second configuration, may have a bend radius 300 of less than about 1 cm; less than about 0.5 cm; or less than about 0.1 cm. As used herein, a bend radius 300 may refer to the minimum radius which forms inside the curvature of the substrate 18, once the substrate 18 is bent along the central transverse axis T. The smaller the bend radius 300, the greater the material flexibility and the higher the likelihood that the location tracking assembly 10 can simulate actual currency when positioned in a currency pack.

The flexure 166 may be bendable by a stress to allow the first portion 110 of the substrate 18 to move relative to the second portion 120 of the substrate 18 and to transition the location tracking assembly 10 to the second configuration shown in FIG. 4. In the second configuration, the first portion 110 of the substrate 18 and the second portion 120 of the substrate 18 may form an angle of less than 180 degrees; less than about 135 degrees; less than about 90 degrees; less than about 60 degrees; less than about 45 degrees; less than about 30 degrees; less than about 10 degrees; less than about 5 degrees or about 0 degrees (e.g., substantially parallel). In some embodiments, tracking assembly 10 may be bent at flexure 166 to an extent such that first power cell 130 overlays and/or abuts second power cell 132, as illustrated in FIG. 4.

In the second configuration, optionally due to the mass of the first power cell 130 and the second power cell 132, a center of mass of the assembly 10 may be located between the first power cell 130 and the second power cell 132, at flexure 166.

Figure 5:
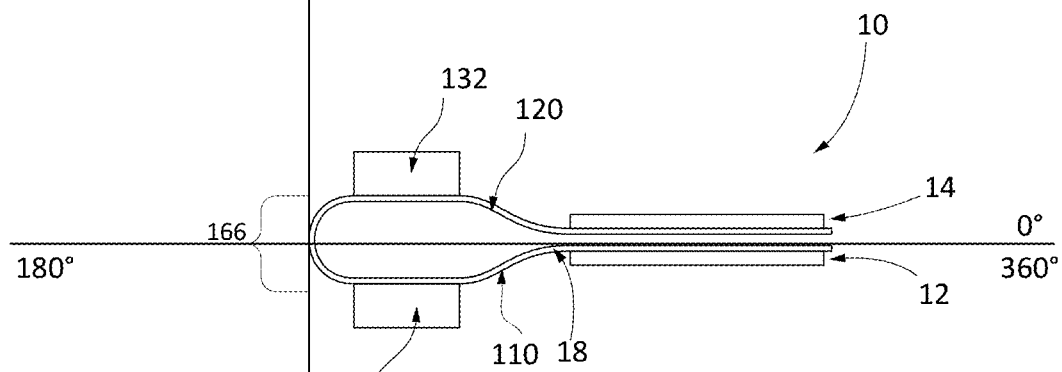
FIG. 5 is a side view of the exemplary tracking assembly of FIG. 2, in another bent configuration in accordance with an exemplary embodiment of the present invention.

Referring now to FIG. 5, the location tracking assembly 10 may be bent in a direction opposite to the direction shown in FIG. 3 to transition the location tracking assembly 10 to an alternative second configuration such that the tracking assembly 10 forms a "U" shape. In the alternative second configuration, the first portion 110 of the substrate 18 and the second portion 120 of the substrate 18 may form an angle of greater than 180 degrees; greater than about 225 degrees; greater than about 270 degrees; greater than about 300 degrees; greater than about 315 degrees; greater than about 330 degrees; greater than about 345 degrees; greater than about 350 degrees or about 360 degrees (e.g., substantially parallel). In another embodiment, the alternative second configuration the first portion of the substrate 110 and the second portion of the substrate 120 may form an angle of roughly 360 degrees. In this second configuration, optionally due to the mass of the first power cell 130 and the second power cell 132, a center of mass of the assembly 10 may be located between the first power cell 130 and the second power cell 132.

Figure 6:
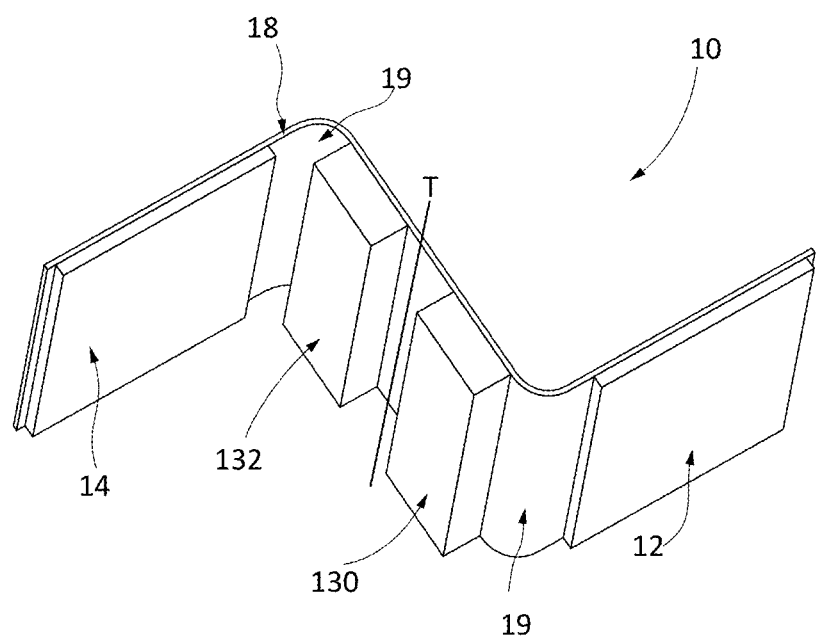
FIG. 6 is a perspective side view of the exemplary tracking assembly of FIG. 2, in a third bent configuration in accordance with an exemplary embodiment of the present invention.

In one configuration, shown in FIG. 6, the tracking device may comprise a continuous substrate 18, which itself may be relatively flexible, bending into a third "S-shape" configuration, forming three individual regions. Region one may be comprised of second rigid printed circuit assembly 14, region 2 may be comprised of power cells 130 and 132 and region 3 may be comprised of module 11. The "S-shape" bending may further simulate actual currency flexibility.

The substrate 18 may have flexible interconnects 19 which may be defined as relatively more flexible portions of the continuous substrate. The relatively more flexible portions may contain cutouts 20 as shown in FIG. 2 to increase flexibility and to allow 'twisting' of the electronic sections relative to each other and/or may comprise a portion of the substrate with relatively reduced thickness as compared to the rest of the substrate, to create living hinges or flexure bearings that increase the flexing and particularly torsional twisting ability of the currency anti-theft pack. A combination of notches and reduced substrate thickness may be used in a continuous substrate embodiment, or any other means for supplying the requisite flexibility. Notches 20 may also be provided in the flexible interconnects 19 used to connect separate substrates on which the modules are positioned, as shown in FIG. 2.

In the embodiment shown in the figures, the cellular antenna 28, Wifi Antenna 34, GNSS antenna 26 and/or beacon antenna 30 is configured for insertion between individual currency bills of housing 5. This configuration allows additional room for the other modules within the hollowed cutout of the housing 5. Cellular antenna 28, Wifi Antenna 34, GNSS antenna 26 and/or beacon antenna 30, according to these embodiments, may also serve as a stabilization tab to secure the location tracking assembly 10 within housing 5. Thus, in at least one embodiment, only a portion of the tracking assembly is housed within the medial cutout in the housing, because at least cellular antenna 28, Wifi Antenna 34, GNSS antenna 26 and/or beacon antenna 30 is positioned outside of the cutout, between the currency bills. For added flexibility, the cellular antenna 28, Wifi Antenna 34, GNSS antenna 26 and/or beacon antenna 30 may comprise a flexible substrate such as for example, fiberglass, KAPTON® polyamide film, or other similar materials.

Figure 7:
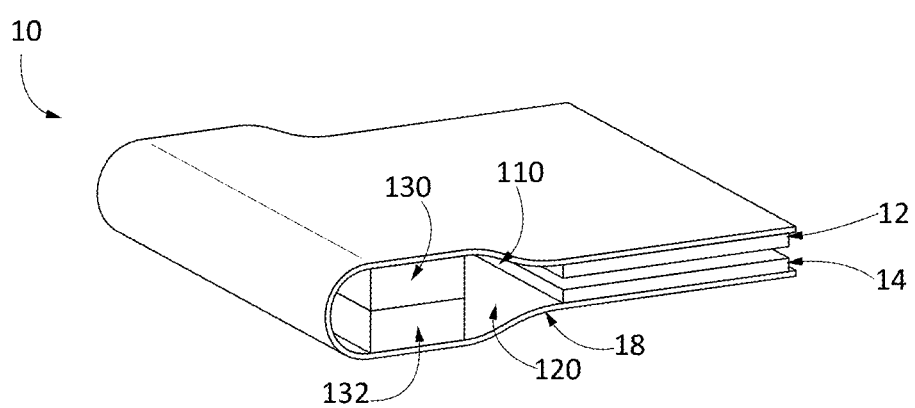
FIG. 7 is a perspective side view of the exemplary location tracking assembly of FIG. 2, in a second, bent configuration in accordance with an exemplary embodiment of the present invention.

FIG. 7 is a perspective view of the U-shape configuration shown in FIG. 4.

Figure 8:
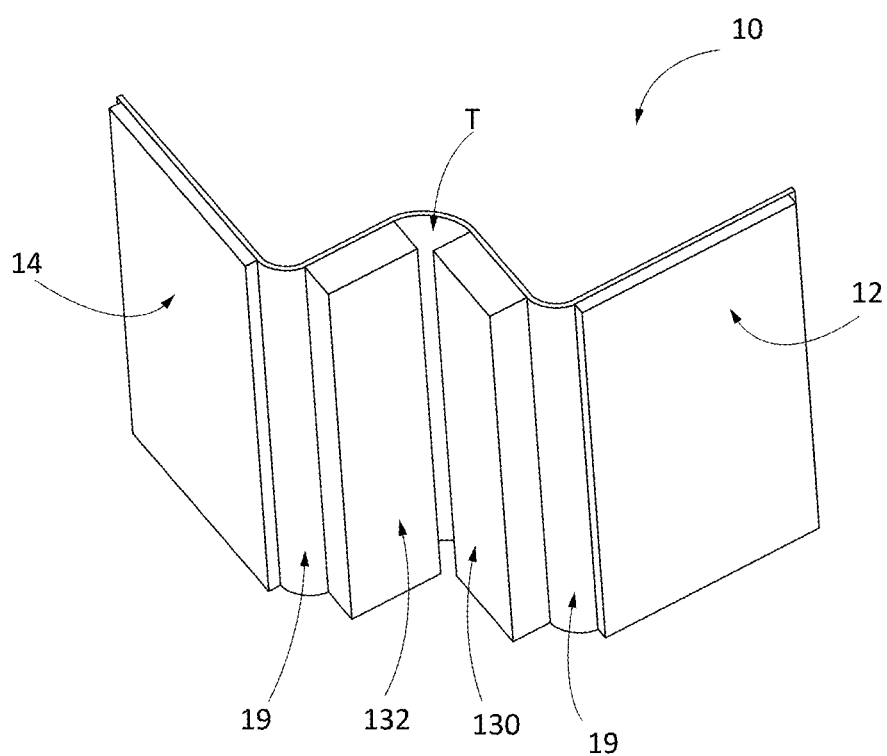
FIG. 8 is a perspective side view of the exemplary tracking assembly of FIG. 2, in a fourth bent configuration in accordance with an exemplary embodiment of the present invention.

Referring now to FIG. 8, the location tracking assembly 10 may be bendable from the "S-shape" configuration (shown in FIG. 5) to a "W-shape" configuration (shown in FIG. 8). The "W-shape" configuration may be achieved by bending the location tracking device 10 at the flexure 166, causing power cell 132 to be on the left side of flexure 166 and power cell 130 to be on the right side of flexure 166.

In some embodiments, different combinations of components 12, 14, 130 and 132, may be positioned on opposing sides of substrate 18 for added flexibility and ability to flex into a more extreme shapes.

Figure 9:
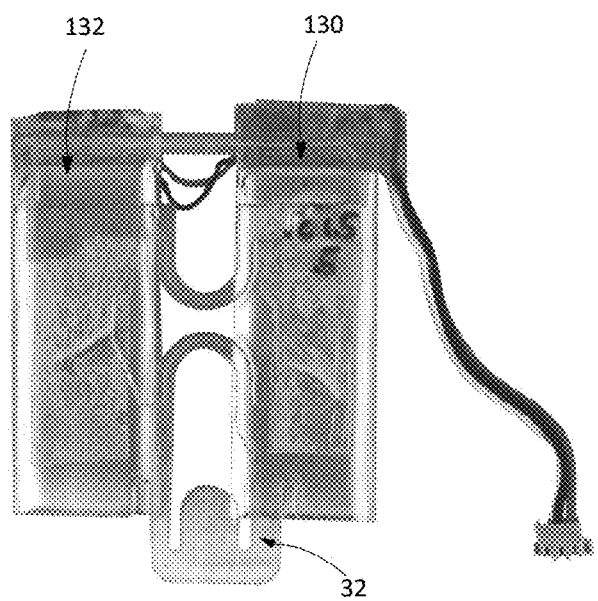
FIG. 9 is a top plan view of a power pack, in accordance with an exemplary embodiment of the present invention.

Referring now to FIG. 9, the battery pack is shown with the flexible mount 32. The battery pack may be comprised of two freely moving cells (first power cell and second power cell). The flexible mount 32 may be used to attach the battery pack to the flexible printed circuit board without restricting motion. In one embodiment, the battery pack may have a typical capacity of 640 mAh; a minimum capacity of 600 mAh; a nominal voltage of 3.7V; a maximum discharge current of 1.5 C and a maximum charge current of 0.7 C.

Figure 10:
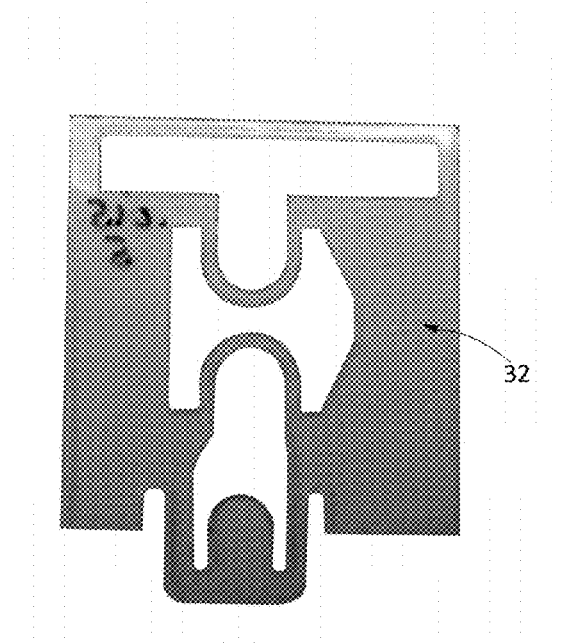
FIG. 10 is a top plan view of a flexible mount for a power pack, in accordance with an exemplary embodiment of the present invention.

Referring now to FIG. 10, a flexible mount 32 according to some embodiments is shown. The flexible mount 32, in some embodiments, may be a piece of plastic (e.g., polycarbonate) that first power cell 130 and second power cell 132 are attached to, which may be further attached to the flexible substrate 18. In some embodiments, first power cell 130 and second power cell 132 may be fixed to flexible mount 32 via, for example, adhesive, tape, and/or one or more mechanical fasteners. Flexible mount 32, in some embodiments, may be attached to flexible substrate 18 via, for example, adhesive, tape, and/or one or more mechanical fasteners. In some embodiments, flexible mount 32 may be configured to clip onto flexible substrate 18. In some embodiments, flexible mount 32 is sized and shaped to fit on flexible substrate 18 between first rigid printed circuit assembly 12 and second rigid printed circuit assembly 14 as previously discussed. In some embodiments, flexible mount 32 may include one or more cutouts. In some embodiments, the one or more cutouts may be shaped to allow flexible mount 32 to clip onto flexible substrate 18. In some embodiments, the one or more cutouts may be shaped and positioned to improve flexibility of the flexible mount 32, for example, along a portion intended to sit along central transverse axis T.

Figure 11:
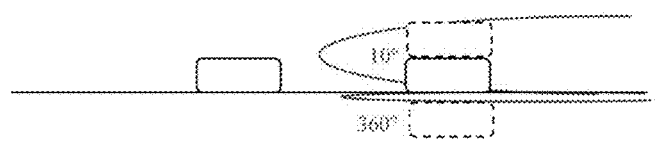
FIG. 11 is an exemplary configuration, illustrating the degree of flexibility for the location tracking assembly.

Referring now to FIG. 11 the flexibility of the location tracking assembly is shown, wherein the first portion of the substrate and the second portion of the substrate can form an angle of anywhere between 10 degrees to 360 degrees Although no specific mention is made herein of the details of the control electronics for coordinating the functions of the system, such control electronics are well known in the art, and may be positioned on the power cells, or portions thereof may be spread across one or more of the other modules. Finally, while the term "module" is used for referring to discrete functional units of the present invention, it should be understood that certain functional units may be combined into a single physical unit, such as, for example, the GPS antenna and the GPS electronics, or the functional units may be physically discrete but co-located on a single substrate or substrate portion. Thus, while the invention is depicted in the figures with physically discrete modules, it is well within the scope of this invention for one or more modules to be physically combined or for a single module to be physically split into two or more sections. For example, one embodiment may comprise one or more modules located on one substrate or substrate portion, and the remaining module or modules located on another substrate or substrate portion, with one or more flexible interconnections between the two substrates or substrate portions. In another embodiment, one module may have one or more components physically located on one substrate or substrate portion and one or more components located on another substrate or substrate portion, with flexible interconnects between portions of the module. What is important is that at least one module is separated from at least one other module, or at least one substrate or substrate portion is separated from at least one other substrate or substrate portion, by one or more flexible interconnects. Thus, embodiments having two, three, four, or even five or more substrates or substrate portions connected by flexible interconnects may be devised.

The embodiment shown and described above may be used for tracking and location of stolen currency much in the same way that traditional dye packs are used. The flexible security device described above is typically positioned between two sheets of genuine currency and may be further bound with a standard money strap, and put in a known location within the institution. When a thief requests that the institution hand over genuine currency, the institution causes the stack containing the flexible security device to be taken along with the genuine currency stacks desired to be tracked. The location tracking device 10 may be activated by any means known in the art. For example, some systems may use a special plate on which the security device sits until its use, and once separated from the plate as detected by electronics in the security device, the device may be activated after a predetermined amount of time as computed by an integral timer. Other systems may use a field surrounding the door to the institution, which activates the device once it passes through the door. The invention is not limited to any particular means for activation. In fact, unlike dye packs, which are typically programmed not to activate inside the bank, where an armed and dangerous robber might harm the institution's patrons if he realizes his robbery has been foiled, the tracking and location information may advantageously be activated immediately. Instant activation may allow the tracking authorities to tell if the robber is still within the building, and potentially determine his or her route for escape from the building.

Once activated, the location tracking assembly retrieves global positioning system coordinates of the device and establishes wireless communications between the device and a receiver for the wireless communications. The coordinates of the device are then transmitted to the receiver via wireless communications. The transmissions may be continuous or periodic, depending on whatever protocol is programmed into the device to meet the user's needs.

Flexible security devices within the scope of this invention are not limited only for use in currency, and may be used for tracking any object, for which there may be an advantage to having a flexible tracking and location assembly. Methods of using such devices include providing the device and causing it to be taken along with the object intended to be tracked. The device is activated to retrieve global positioning system coordinates of the device and to establish wireless communications between the device and a receiver for the wireless communications as discussed above. The device transmits coordinates of the device via the wireless communications to the receiver to allow tracking and location of the object to be tracked.

The figures, as shown, are not necessarily drawn to scale. As noted above, although specific modules are discussed herein and shown located on physically discrete substrates or substrate sections separated by flexible interconnections, it should be understood that designs may be provided in which components of one or more of the modules may be spread across multiple substrates or substrate sections. Such a device may comprise a plurality of substrate sections separated by flexible interconnections, in which the device as a whole comprises all of the aforementioned functionality. While the embodiments described herein fall within the scope of such a description, additional configurations may also fall within that scope. The location tracking assembly of such a device may be characterized as comprising a plurality of substrates or substrate portions separated by interconnects between each set of adjacent substrates or substrate portions, one or more of the interconnects comprising flexible interconnects having sufficient flexibility to permit relative movement of at least one substrate or substrate portion relative to an adjacent interconnected substrate or substrate portion.

In such an embodiment, the location tracking assembly comprises wireless communications means for conducting wireless communications between the assembly and a wireless communications receiver; positioning means for retrieving geographic location information about the device; power means for powering the wireless communications means and the positioning means; and control means for controlling the wireless communications means and the positioning means to transmit geographic location information about the device by wireless communications to the wireless communications receiver. The wireless communications means may comprise any wireless communications technology known in the art and its equivalents, and the positioning means may comprise any GPS technology or other technology known for providing geographic information about the location of a device. The control means may comprise any combination of hardware and software known in the art capable of being programmed with instructions for processing and performing those instructions, such as a computer processing unit (CPU). The control means may have pre-programmed instructions, or may be reprogrammable to allow providing specific instructions to suit a specific user's needs. The power source may be a battery or any equivalent source capable of generating electricity for powering electronic components.

Thus, a number of embodiments disclosed herein provide an improved currency anti-theft pack ideal for tracking, locating and recovering stolen currency, because of visual similarity to an actual currency pack, extreme flexibility, and handling very nearly like a real stack of currency, including a realistic feel and the ability to "riffle" and fold the currency. The embodiments described herein further maximize the space available within the currency pack to house the tracking and locating devices, in particular the wireless communication antennas and the associated electronics and power sources such as batteries, without degrading the overall flexibility and realism of the currency pack. This assembly as described herein also provides an easy and reliable configuration for accessing components of the currency anti-theft pack for repair, maintenance and reconfiguration to various tracking modes.

Although specific embodiments are described herein, the present invention is not intended to be limited to the details described. Numerous modifications can be made to the details of the design without departing from the scope of the invention. Such modifications may include, but are not limited to, variations such as modifying the size of the hollowed cutout; alternating materials, sizes, and shapes of cover sheets and cushioning elements; providing multiple cover sheets or cushioning elements, providing alternate lacing or banding configurations, such as using plastic ties or straps, or rubber bands; using alternate materials for the flexible interconnects; incorporating alternate tracking and locating components, such as "beacon" or other "homing" devices; and/or incorporating additional means to deter theft, such as dye, ink, smoke, teargas, audible alarms, etc., as are known in the art. Accordingly, it is intended that the appended claims cover all such variations as fall within the spirit and scope of the claims.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the device. Unless specifically set forth herein, the terms "a", "an" and "the" are not limited to one element but instead should be read as meaning "at least one". As used herein, the terms "about" or "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

We claim:

1. An electronic tracking device comprising:
   a first power cell positioned on a first portion of a substrate;
   a second power cell positioned on a second portion of the substrate, the second power cell being spaced apart from the first power cell by a gap;
   the substrate comprising a flexible printed circuit board having a flexure disposed along a central transverse axis of the substrate between the first portion and the second portion of the substrate, the flexure being bendable to allow the first portion to move relative to the second portion between a first configuration wherein the first portion is substantially coplanar with the second portion of the substrate and a second configuration wherein the first portion and the second portion of the substrate forms an angle of greater than or less than about 180 degrees,
   wherein, in the first configuration, a center of mass of the electronic tracking device is located in the gap between the first power cell and the second power cell.

2. The electronic tracking device of claim 1, wherein the substrate comprises an insulating polymer film having one or more conductive circuit patterns extending through the flexure from the first portion to the second portion.

3. The electronic tracking device of claim 1, further comprising one or more electronics modules, each of the one or more electronics modules being electrically connected to the first power cell and/or the second power cell.

4. The electronic tracking device of claim 3, wherein the one or more electronics modules are independently selected from the group consisting of a wireless communications antenna module, a wireless communications receiver module, and a global positioning system antenna module.

5. The electronic tracking device of claim 3, wherein the one or more electronics modules comprises at least a first electronics module positioned on the first portion and at least a second electronics module positioned on the second portion of the substrate.

6. The electronic tracking device of claim 1, wherein, in the second configuration, the first portion and the second portion of the substrate forms an angle of about 0 degrees.

7. The electronic tracking device of claim 6, wherein, in the second configuration, the flexure is configured to have a bend radius of less than 1 cm.

* * * * *